United States Patent [19]
Yanagihara et al.

[11] Patent Number: 5,523,623
[45] Date of Patent: Jun. 4, 1996

[54] OHMIC ELECTRODE FOR A P-TYPE COMPOUND SEMICONDUCTOR AND A BIPOLAR TRANSISTOR INCORPORATING THE OHMIC ELECTRODE

[75] Inventors: Manabu Yanagihara, Toyonaka; Akiyoshi Tamura, Suita, both of Japan

[73] Assignee: Matsushita Electric Industrial Co., Ltd., Osaka, Japan

[21] Appl. No.: 399,180

[22] Filed: Mar. 6, 1995

[30] Foreign Application Priority Data

Mar. 9, 1994 [JP] Japan ................................ 6-038247
Jul. 15, 1994 [JP] Japan ................................ 6-163754

[51] Int. Cl.⁶ ............................................. H01L 29/45
[52] U.S. Cl. .......................... 257/745; 257/751; 257/763; 257/764; 257/766
[58] Field of Search ............................... 257/742–745, 257/750, 751, 763, 764, 766, 769, 741, 768, 197, 198, 584, 587

[56] References Cited

U.S. PATENT DOCUMENTS

| | | | |
|---|---|---|---|
| 4,673,593 | 6/1987 | Himoto | 427/89 |
| 4,853,346 | 8/1989 | Baker et al. | 437/184 |
| 5,077,599 | 12/1991 | Yano et al. | 357/71 |
| 5,179,041 | 1/1993 | Yano et al. | 437/184 |
| 5,284,798 | 2/1994 | Ibuka et al. | 437/184 |

FOREIGN PATENT DOCUMENTS

| | | | |
|---|---|---|---|
| 0222395 | 5/1987 | European Pat. Off. | 257/766 |
| 0102071 | 5/1986 | Japan | 257/763 |
| 0219518 | 9/1987 | Japan . | |
| 0234322 | 10/1987 | Japan . | |
| 0046773 | 2/1990 | Japan . | |
| 0097067 | 4/1990 | Japan | 257/745 |
| 0264474 | 10/1990 | Japan | 257/766 |
| 0184377 | 8/1991 | Japan . | |
| 0286526 | 12/1991 | Japan . | |
| 0092471 | 3/1992 | Japan | 257/745 |

OTHER PUBLICATIONS

Mochizuki et al., Au/Pt/Ti/Ni Ohmic Contacts to p–ZnSe, Electronics Letters, Nov. 10, 1994, vol. 30, No. 23, pp. 1984–1985.

Okada et al, Japanese Journal of Appl. Physics, vol. 30, No. 4A, pp. L558–L–560, 1991, "Electrical Characteristics & Reliability of Pt/Ti/Pt/Au . . . ".

Sugiyama et al, Extended Abs. of 1993 Intl. Conf. on Solid State Devices & Materials, Makuhari, pp. 1062–1064, 1993.

Primary Examiner—Peter Toby Brown
Attorney, Agent, or Firm—Renner, Otto, Boisselle & Sklar

[57] ABSTRACT

An ohmic electrode for a p-type III–V compound semiconductor is disclosed. The ohmic electrode formed on a p-type III–V compound semiconductor layer includes nickel (Ni), titanium (Ti), and platinum (Pt) as main components in an interface between the ohmic electrode and the p-type III–V compound semiconductor layer.

15 Claims, 10 Drawing Sheets

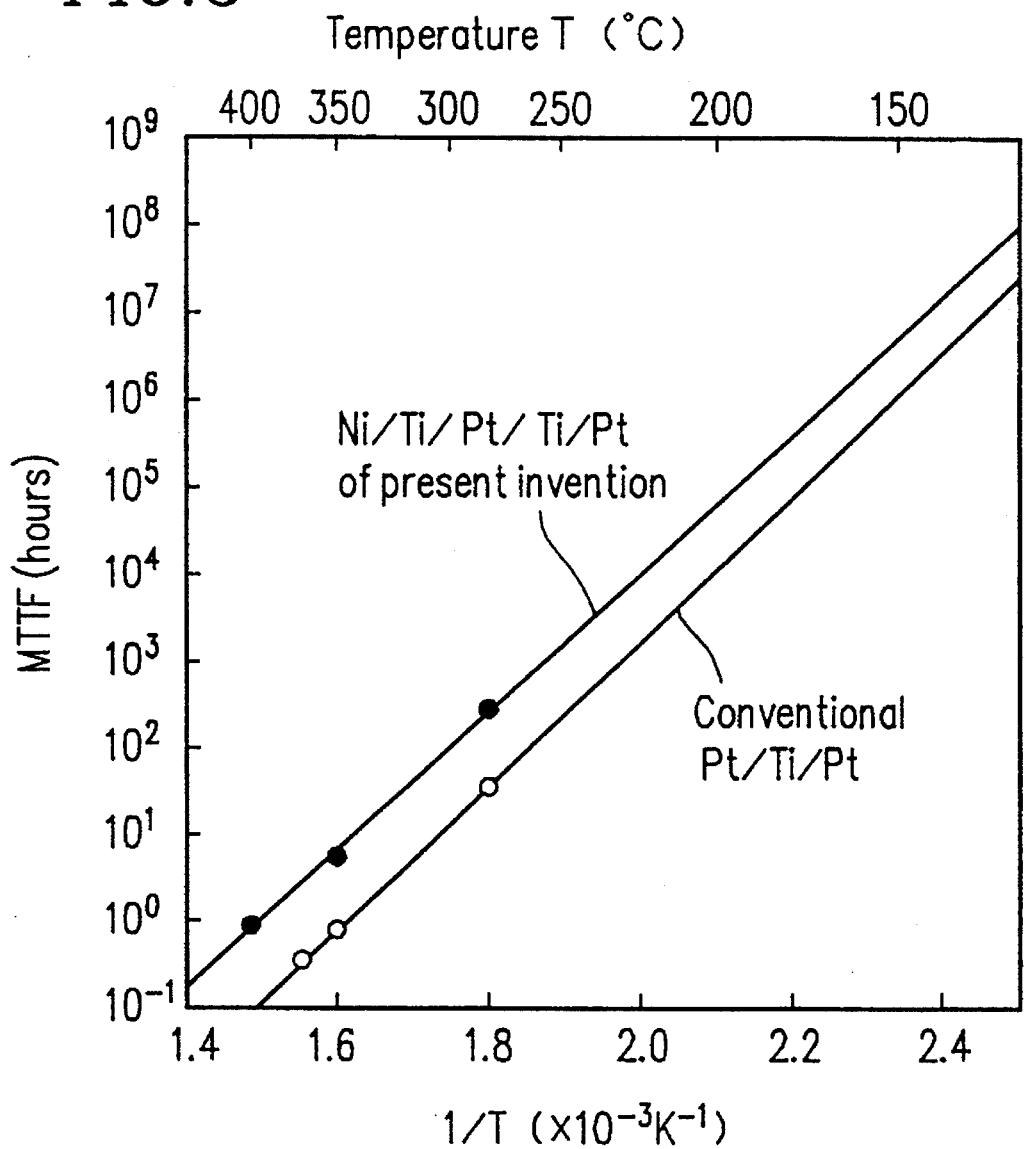

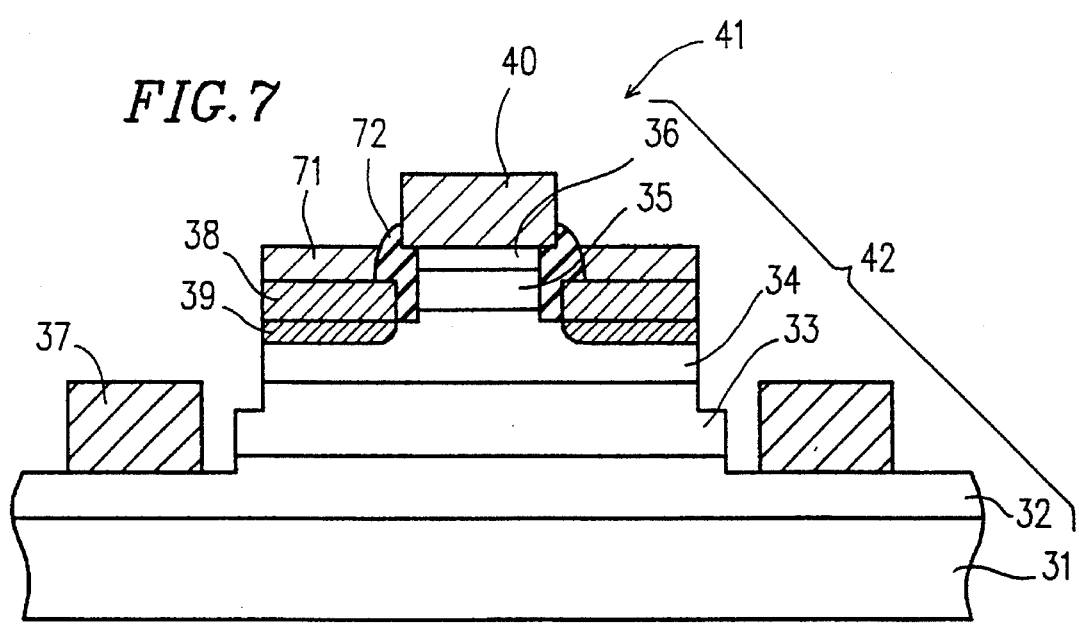

OHMIC ELECTRODE FOR A P-TYPE COMPOUND SEMICONDUCTOR AND A BIPOLAR TRANSISTOR INCORPORATING THE OHMIC ELECTRODE

BACKGROUND OF THE INVENTION

1. Field of the Invention

The present invention relates to a low resistance ohmic electrode for semiconductors composed of III—V group compounds having a p-type conductivity (hereinafter, such a semiconductor will be referred to as a "p-type III–V compound semiconductor"), and a bipolar transistor incorporating the ohmic electrode. The present invention relates to a method for producing the ohmic electrode end a method for producing the bipolar transistor.

2. Description of the Related Art

As a low resistance ohmic electrode for p-type GaAs layers, a Pt/Ti/Pt/Au electrode is drawing much attention (H. Okada, et al., Japanese Journal of Applied Physics Vol. 30, 1991, pp. L558–L560). This ohmic electrode includes a Pt film, a Ti film, a Pt film, and an Au film layered on a p-type GaAs substrate in this order. Since the Schottky junction of Pt is low relative to that of p-type GaAs, the lowermost Pt layer acts to reduce the contact resistance of the electrode. The Ti layer and the middle Pt layer function to prevent mutual diffusion between the Ga and As and the uppermost Au layer.

By using an electrode of this structure as a base electrode for a bipolar transistor, and subjecting it to a heat treatment at 350° C., an extremely low base resistance can be obtained, thereby making the high frequency characteristics of the bipolar transistor excellent. This is reported in Extended Abstracts of the 1993 International Conference on Solid State Devices and Materials, pp. 1062–1064.

On the other hand, an electrode of an Ni/Ti/Ag structure is known as a low-contact resistance electrode for n-type Si layers, as is disclosed in Japanese Laid-Open Patent Publication No. 65-234322.

However, the above-mentioned ohmic electrode has a problem in that, since the low resistance ohmic contact is achieved by conducting an alloying process at a relatively low temperature, the resistance of the ohmic contact increases when the electrode is kept at a temperature exceeding about 350° C. According to an experiment by the inventors of the present invention, as shown in FIG. 10, the contact resistance of the Pt/Ti/Pt/Au electrode becomes minimum when the heat treatment is conducted at about 350° C., and increases at any temperature above 350° C. This is considered to be because compounds, such as $PtAs_2$, that increases the contact resistance is generated at about 400° C. during the heat treatment. When a p-type semiconductor layer included in the ohmic electrode is as thin as a base layer of a hetero-junction bipolar transistor (HBT), $PtAs_2$ and the like may be formed deep from the surface of the p-type semiconductor. As a result, the thickness of the p-type semiconductor layer remaining under the $PtAs_2$ is inevitably reduced, thereby further increasing the contact resistance.

Moreover, the following problem arises during the fabrication of bipolar transistors.

According to an experiment by the inventors, as shown in FIG. 11, n-type AuGe/Ni type ohmic electrodes that are commonly used as collector electrodes of bipolar transistors have such characteristics that the contact resistance thereof becomes minimum at about 400° C. Accordingly, in the fabrication process of a bipolar transistor, it is required to first form a collector electrode, subject the collector electrode to a heat treatment at 400° C., and then form a base electrode and subject the base electrode to a heat treatment at 350° C. so that the contact resistance of a Pt/Ti/Pt/Au base electrode and the contact resistance of an AuGe/Ni type collector electrode are minimized. In other words, it is impossible to form the collector electrode after the formation of the base electrode, creating problems so that the fabrication process of HBTs allows less freedom and that separate heat treatments must be conducted for the base electrode and the collector electrode, respectively.

SUMMARY OF THE INVENTION

The ohmic electrode for a p-type III–V compound semiconductor of the invention, formed on a p-type III–V compound semiconductor layer, includes nickel (Ni), titanium (Ti), and platinum (Pt) as main components in an interface between the ohmic electrode and the p-type III–V compound semiconductor layer.

In one embodiment of the invention, the ohmic electrode includes palladium (Pd) instead of (Pt).

According to another aspect of the invention, a method for producing an ohmic electrode for a p-type III–V compound semiconductor, includes the steps of: forming a metal layer including Ni, Pt, and Ti as main components on a p-type III–V compound semiconductor layer directly or via a thin layer; and alloying the metal layer with a portion of the p-type III–V compound semiconductor layer by a heat treatment.

In one embodiment of the invention, the metal layer includes a multilayer film comprising a Ni layer, a Ti layer, and a Pt layer, the Pt layer being an upper-most layer, and the Ti layer having a thickness of 10 nm or less.

In another embodiment of the invention, Pd is used instead of Pt.

In still another aspect of the invention, the heat treatment is conducted at a temperature in the range of 360° C. to 460° C. during the alloying step.

According to still another aspect of the invention, a bipolar transistor includes: a semiconductor multilayer structure including at least on a p-type III–V compound semiconductor layer; and a p-type ohmic electrode formed on the p-type III–V compound semiconductor layer and including Ni, Ti, and Pt as main components.

In one embodiment of the invention, the semiconductor multilayer structure further includes at least on an n-type III–V compound semiconductor layer and the bipolar transistor further comprises an n-type ohmic electrode formed on the n-type III–V compound semiconductor layer and including gold (Au), germanium (Ge), and Ni as main components.

In one embodiment of the invention, the ohmic electrode includes Pd instead of Pt.

According to still another aspect of the invention, a method for producing a bipolar transistor includes the steps of: forming a first metal layer including Ni, Pt, and Ti as main components on a p-type III–V compound semiconductor layer directly or via a thin layer; and alloying the first metal layer with a portion of the p-type III–V compound semiconductor layer by a heat treatment.

In one embodiment of the invention, the first metal layer comprises a multilayer film including a Ni layer, a Pt layer, and a Ti layer, the Pt layer being an uppermost layer, wherein the Ti layer and the Ni layer each have a thickness of 10 nm or less.

In another embodiment of the invention, the method further includes a step of forming a second metal layer including Au, Ge, and Ni as main components on an n-type III–V compound semiconductor layer directly or via another thin layer, the step being conducted between the step of forming the first metal layer and the alloying step.

In still another aspect of the invention, the second metal layer is simultaneously alloyed with the n-type III–V compound semiconductor layer at the alloying step.

According to still another aspect of the invention, a method for producing a bipolar transistor includes the steps of: etching a part of a semiconductor multilayer structure from the upper face thereof, wherein the semiconductor multilayer structure includes a first n-type III–V compound semiconductor layer, a p-type III–V compound semiconductor layer stacked above the first n-type III–V compound semiconductor layer, and a second n-type III–V compound semiconductor layer stacked above the p-type III–V compound semiconductor layer, and etching is performed until the p-type III–V compound semiconductor layer is exposed or until a thin layer remains on the p-type III–V compound semiconductor layer; forming a first metal film on the exposed p-type semiconductor layer or the exposed thin layer, the first metal film including Ni, Ti, and Pt or Pd; simultaneously etching the first metal film and the p-type III–V compound semiconductor layer until the first n-type III–V compound semiconductor layer is exposed or until another thin layer remains on the first n-type III–V compound semiconductor layer; forming a second metal film on the exposed first n-type III–V compound semiconductor layer or the exposed another thin layer, the second metal film including Au, Ge, and Ni; and alloying the first metal film with the p-type III–V compound semiconductor layer and alloying the second metal film with the first n-type III–V compound semiconductor layer by a heat treatment such that a p-type ohmic electrode and an n-type ohmic electrode are simultaneously formed on the p-type III–V compound semiconductor layer n-type III–V compound semiconductor layer, respectively.

In one embodiment of the invention, the method further includes The steps of: forming a side wall on a side face of the semiconductor multilayer structure exposed by the first etching step, after forming the first metal film; and forming a low resistance metal layer on the first metal film.

In another embodiment of the invention, the low resistance metal layer is formed by plating.

By forming a metal layer including Ni, Ti, and Pt on a p-type III–V compound semiconductor layer directly or via a thin layer, and subjecting the metal layer to a heat treatment, the Ni and Ti prevents the generation of high resistance compounds such as $PtAs_2$ or acts to prevent the Pt from becoming diffused deeply into the p-type III–V compound semiconductor layer, thereby providing a low contact resistance between the ohmic electrode and the p-type semiconductor layer. Furthermore, an alloy composed of Ni, Ti, and Pt has a lower Schottky junction with respect to p-type semiconductors than that obtained in the case of Pt alone.

Since the heat treatment for the formation of an ohmic contact having a low contact resistivity is performed at a temperature substantially equal to the temperature of the heat treatment conducted for the formation of n-type ohmic electrodes composed of Au, Ge, and Ni, it is possible to simultaneously perform the heat treatment for the p-type ohmic electrode and the heat treatment for the n-type ohmic electrode at the same time.

By applying the ohmic electrode of the present invention to a bipolar transistor, it becomes possible to form n-type ohmic electrodes and p-type ohmic electrodes in any desired order, thereby increasing the freedom in designing the production method and structure of the device.

Furthermore, by providing a low resistance layer on a p-type ohmic electrode so as to become a base electrode, the base resistance of the device is further reduced, thereby improving the high-frequency characteristics of the device operating at a high speed.

Thus, the invention described herein makes possible the advantages of (1) providing a ohmic electrode having a low contact resistance which becomes minimum in the vicinity of an optimum temperature for the heat treatment for n-type AuGe/Ni type ohmic electrodes, and a bipolar transistor incorporating the ohmic electrode; and (2) providing a method for producing the ohmic electrode and a method for producing the bipolar transistor.

These and other advantages of the present invention will become apparent to those skilled in the art upon reading and understanding the following detailed description with reference to the accompanying figures.

BRIEF DESCRIPTION OF THE DRAWINGS

FIG. 5 is a graph showing the relationship between the storage temperature and the MTTF of the p-type ohmic electrode of the present invention and a conventional p-type ohmic electrode.

FIG. 7 is a cross-sectional view showing the construction of a bipolar transistor according to the present invention.

DESCRIPTION OF THE PREFERRED EMBODIMENTS

Hereinafter, the present invention will be described by way of examples with reference to the accompanying figures.

First, the ohmic electrode according to the present invention and the method for producing the same will be described.

Figure 1:
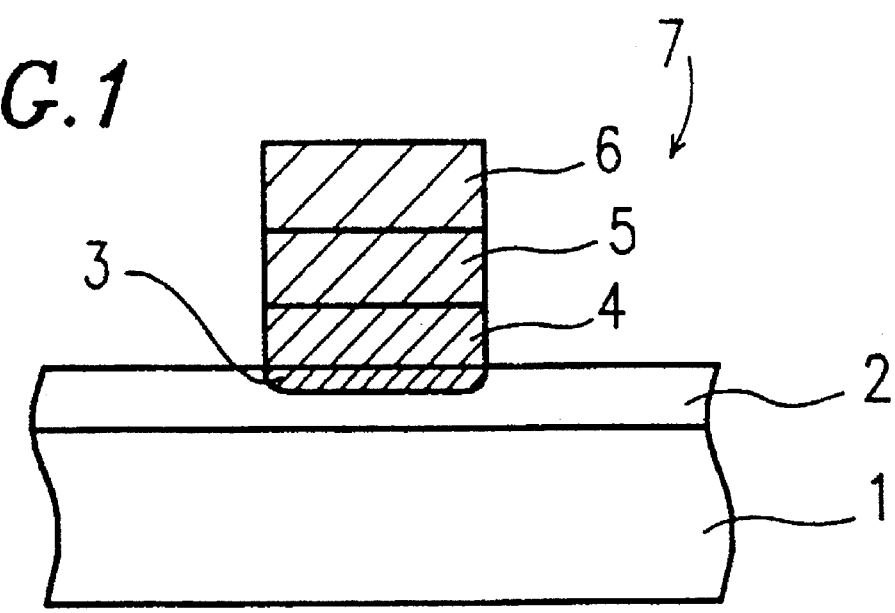
FIG. 1 is a schematic cross-sectional view showing the construction of an electrode incorporating an ohmic electrode according to the present invention.

FIG. 1 schematically shows a cross section of an electrode 7 in which an ohmic electrode 4 of the present invention is used. As shown in FIG. 1, a p-type GaAs layer 2 is formed on a semi-insulating GaAs substrate 1. The p-type ohmic electrode 4, which is composed of an alloy layer of nickel, titanium, and platinum, is formed on the p-type GaAs layer 2. A diffusion layer 3, in which nickel, titanium, and platinum (which constitute the p-type ohmic electrode 4) are diffused, is formed in the p-type GaAs layer 2 in the portion below the p-type ohmic electrode 4. In other words, the p-type ohmic electrode 4 and the GaAs layer 2 are alloyed to each other in the diffusion layer 3. A titanium layer 5 is formed on the p-type ohmic electrode 4. A platinum layer 6 Is formed on the titanium layer 5.

The electrode 7 is formed by the following method, for example.

Figure 2A:
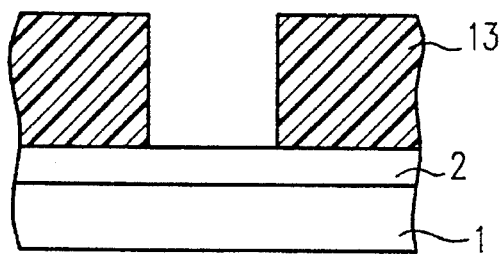
FIGS. 2A to 2E are cross-sectional views for describing a method for producing a p-type ohmic electrode according to the present invention.

As shown in FIG. 2A, the p-type GaAs layer 2 is epitaxially grown on the semi-insulating GaAs substrate 1. The p-type GaAs layer 2, on which the ohmic electrode 4 is to be formed, may be any GaAs semiconductor layer having a p-type conductivity; the impurity concentration and thickness thereof may be adjusted to a specific purpose. In the present example, the p-type GaAs layer 2 has a thickness of 150 nm and a carrier density of $2 \times 10^{19}$ cm$^{-3}$. Furthermore, a resist pattern 13 with an opening having a desired shape is formed on the p-type GaAs layer 2.

Figure 2D:
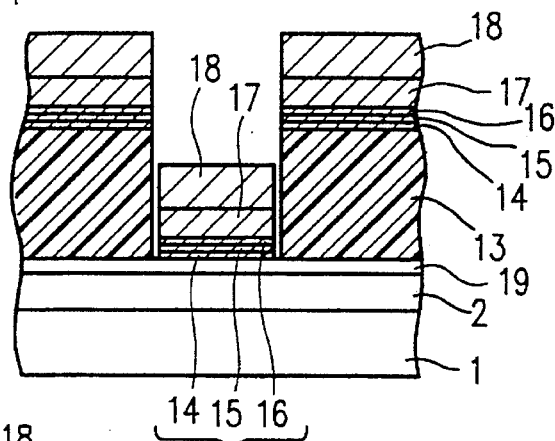
Figure 2B:
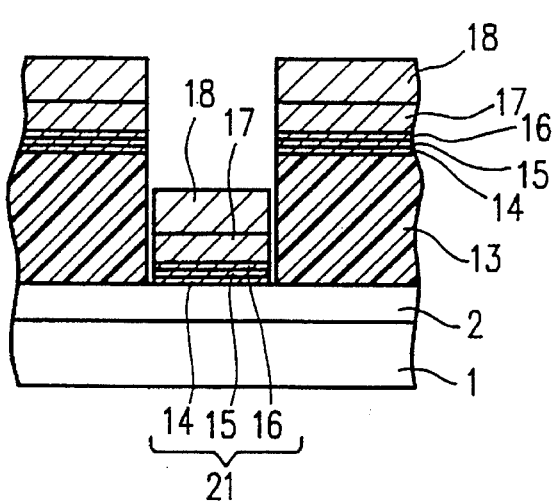

Next, as shown in FIG. 2B, a Ni film 14 (thickness: 5 mm), a titanium film 15 (thickness: 5 nm), a Pt film 16 (thickness: 5 nm), a titanium film 17 (thickness: 30 nm), and a P=film 18 (thickness: 100 nm) are successively deposited by an electron beam vapor deposition method in this order. The Ni film 14, Ti film 15, and the Pt film 16 constitute a metal multilayer film 21 to become the p-type ohmic electrode 4. Alternatively, the Ni film 14 and the Ti film 15 may be reversed. That is, the Ti film 15 (thickness: 5 nm), the Ni film 14 (thickness: 5 nm), the Pt film 16 (thickness: 5 nm), the titanium film 17 (thickness: 30 nm), and the Pt film 18 (thickness: 100 nm) may be formed on the p-type GaAs layer 2 in this order. Moreover, the titanium film 17 and the Pt film 18 merely function as a pad, and therefore are dispensable as an ohmic electrode for p-type compound semiconductors. Accordingly, an ohmic electrode for p-type compound semiconductors should only include the Ni film 14, Ti film 15, and the Pt film 16, with the Pt film 16 being the uppermost layer of the metal multilayer film 21.

Figure 2E:
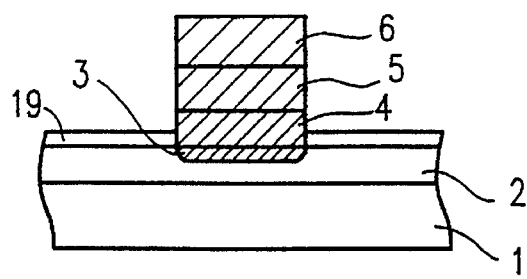
Figure 2C:
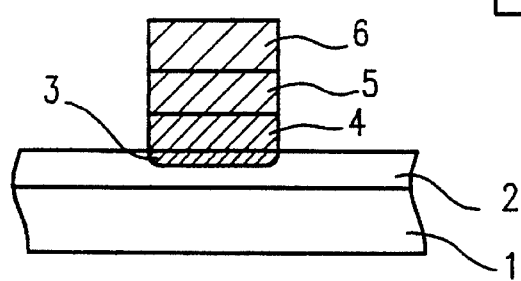

If the thicknesses of the Ni film 14 and the Ti film 15 are too large, it becomes difficult for Pt atoms in the Pt film 16 to enter the p-type GaAs layer 2 during a subsequent heat treatment, so that the diffusion layer 3 shown in FIG. 2C may not be formed. Therefore, the thicknesses of the Ni film 14 and the Ti film 15 are preferably in the range of 1 nm to 50 nm, and more preferably 2 nm to 10 nm.

Thereafter, a lift-off method is conducted where the resist pattern 13 is dissolved with acetone, and the respective metal films are patterned into desired shapes.

Next, as shown in FIG. 2C, the Ni film 14, Ti film 15, and Pt film 16 are alloyed with one another by conducting a heat treatment at 400° C. for 10 minutes so as to form the p-type ohmic electrode 4. Moreover, a portion of Ni, Ti, and Pt constituting the Ni film 14, Ti film 15, and Pt film 16 is diffused into the p-type GaAs layer 2, whereby the diffusion layer 3 is obtained. The temperature and duration of the heat treatment can be selected, in order to attain a desired contact resistivity, in accordance with the specific characteristics required for an element to which the p-type ohmic electrode 4 is applied. However, the heat treatment is preferably conducted at a temperature in the range of 360° C. to 460° C., more preferably in the range of 370° C. to 420° C. in order to form a p-type ohmic electrode having a low contact resistivity. Since this range of temperatures substantially coincides with the temperature of the heat treatment conducted for the formation of n-type ohmic electrodes composed of Au, Ge, and Ni, it is possible to simultaneously perform a heat treatment for the formation of n-type ohmic electrodes and a heat treatment for the formation of p-type ohmic electrodes at the same temperature.

A metal layer composed of Au or the like may be formed on the uppermost Pt layer 18 in order to reduce the resistance of the electrode itself.

Figure 3:
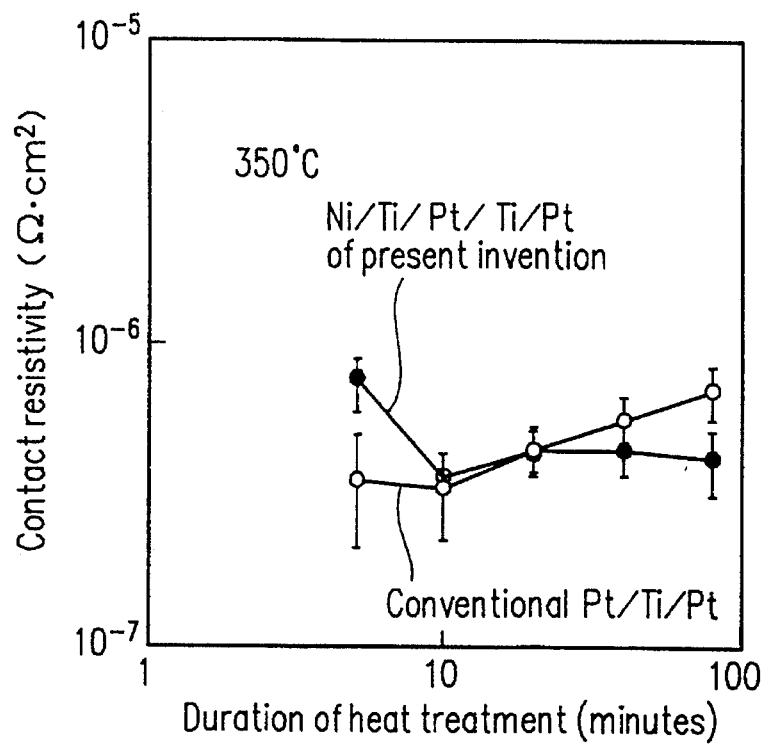
FIG. 3 is a graph showing the relationships between the duration of a heat treatment at 350° C. and the contact resistivity of the p-type ohmic electrode of the present invention and a conventional p-type ohmic electrode.
Figure 4:
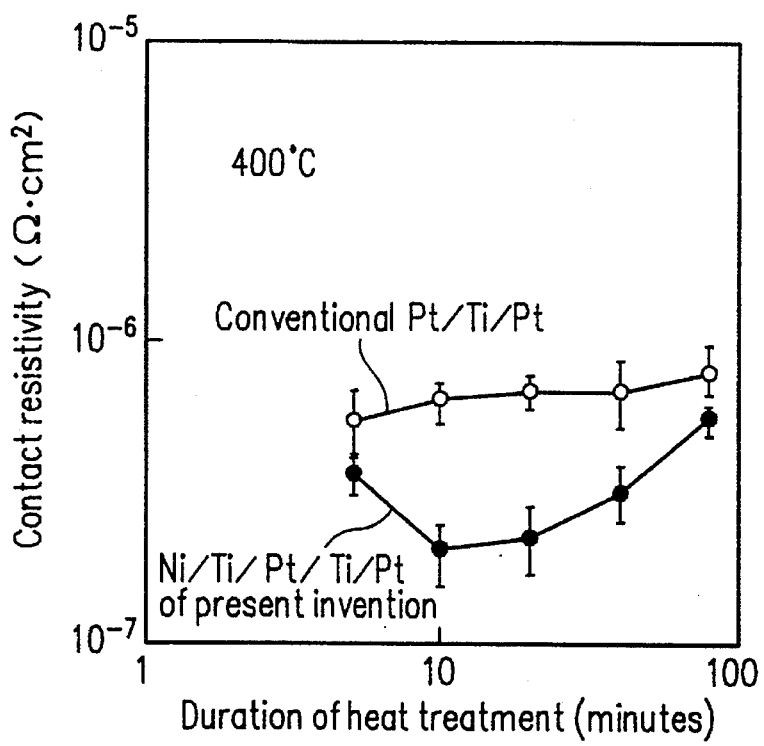
FIG. 4 is a graph showing the relationships between the duration of a heat treatment at 400° C. and the contact resistivity of the p-type ohmic electrode of the present invention and a conventional p-type ohmic electrode.

FIGS. 3 and 4 show the measurement results of the contact resistivity of the electrode 7 including the p-type ohmic electrode 4 produced in the above-mentioned manner. FIG. 3 shows the relationship between the duration of a heat treatment conducted at 350° C. for the formation of the electrode and the contact resistivity. FIG. 4 shows the relationship between the duration of a heat treatment conducted at 400° C. for the formation of the electrode and the contact resistivity. Measurement results of a conventional Pt/Ti/Pt ohmic electrode are also indicated in FIGS. 3 and 4 for comparison.

As seen from FIG. 3, the electrode 7 provides a contact resistivity of about: $3.8 \times 10^{-7}$ Ω·cm$^2$ by conducting a heat treatment at 350° C. for 10 minutes. The contact resistivity thereof hardly increases even if the electrode 7 is subjected to a heat treatment for a long time. For example, the contact resistivity is about $4.2 \times 10^{-7}$ Ω·cm$^2$ after 80 minutes of heat treatment.

On the other hand, the conventional Pt/Ti/Pt ohmic electrode provides a contact resistivity of about $3.6 - 10^{-7}$ ωcm$^2$ by conducting a heat treatment at 350° C. for 10 minutes. However, the contact resistivity increases as the duration of the heat treatment increases. For example, the contact resistivity is about $7.0 \times 10^{-7}$ Ω·cm$^2$ after 80 minutes of heat treatment. As will be appreciated, the ohmic: electrode of the present invention has a high heat resistance.

The advantage of the present invention becomes clearer in the case of a heat treatment at 400° C. As shown in FIG. 4, the electrode 7 of the present example provides a contact resistivity of about $2.1 \times 10^{\times 7}$ Ω·cm$^2$ by conducting a heat treatment at 400° C. for 10 minutes. Although the contact resistivity increases as the duration of the heat treatment increases, the contact resistivity remains at about $5.6 \times 10^{-7}$ Ω·cm$^2$ even after 80 minutes of heat treatment.

On the other hand, the conventional Pt/Ti/Pt ohmic electrode provides a contact resistivity of about $7.0 \times 10^{-7}$ ω·cm$^2$ by conducting a heat treatment at 400° C. for 10 minutes. The contact resistivity increases to about $8.4 \times 10^{-7}$ Ω·cm$^2$ after 80 minutes of heat treatment.

Accordingly, the electrode 7 of the present example has a minimum contact resistivity when the heat treatment is conducted at 400° C., and achieves a lower contact resistivity than that of a conventional p-type Pt/Ti/Pt/Au ohmic electrode.

FIG. 5 shows the results of a high temperature storage test in which the electrode 7 of the present example, obtained by a heat treatment at 400° C. for 10 minutes and a conventional Pt/Ti/Pt ohmic electrode obtained by a heat treatment at 350° C. for 10 minutes are left at temperatures ranging from 300° C. to 400° C. In FIG. 5, the MTTF (Mean Time To Failure) is defined as the mean time required for the contact resistivity to increase by 50%.

As shown in FIG. 5, the gradient of the line representing the electrode 7 is substantially equal to the gradient of the line representing the conventional ohmic electrode. Based on these gradients, the activation energy of the deterioration reaction for the ohmic electrodes is deduced to be about 1.6 eV. This indicates that the electrode 7 of the present example and the conventional ohmic electrode may deteriorate by the same deterioration mechanism. However, electrode 7 of the present example takes a longer deterioration time than the conventional ohmic electrode when left at the same temperature. For example, while the MTTF at 150° C. is $6.5 \times 10^6$ hours for the electrode 7, it is $1.3 \times 10^6$ hours for the conventional ohmic electrode, indicating the comparative excellence of the electrode 7 is five times. It will be appreciated that the electrode 7 of the present example is also excellent in terms of reliability.

Considering the above test results and the like, it is presumed that according to the present invention, the Ni and Ti prevent the generation of high resistance compounds such as $PtAs_2$ at temperatures in the vicinity of 400° C., or prevent the Pt from becoming diffused deeply into the p-type semiconductor layer, thereby leading to the low contact resistance between the ohmic electrode of the present invention and any p-type semiconductor. It is further presumed that an alloy composed of Ni, Tt, and Pt has a lower Schottky Junction with respect to p-type semiconductors than that obtained in the case of Pt alone.

In the above example, as shown in FIG. 2B, the metal multilayer film 21 is formed directly on the p-type GaAs layer 2, a thin semiconductor layer may be interposed between the metal multilayer film 21 and the p-type GaAs layer 2 if a portion of Ni, Ti, and Pt of the metal multilayer film 21 is diffused into the p-type GaAs layer 2, whereby the diffusion layer 3 is obtained by heat treatment, as shown in FIG. 2C. For example, as shown in FIG. 2D, a thin semiconductor layer 19 is formed on the p-type GaAs layer 2 and the metal multilayer film 21 is formed on the p-type GaAs layer 2 via the thin semiconductor layer 19. Then, as shown in FIG. 2E, a portion of Ni, Ti, and Pt of the metal multilayer film 21 is diffused into the p-type GaAs layer 2 through the thin semiconductor layer 19 or is diffused into the p-type GaAs layer 2 accompanying the thin semiconductor layer 19. Simultaneously, the p-type ohmic electrode 4 is formed on the p-type GaAs layer 2 by alloying the metal multilayer film 21.

Figure 6A:
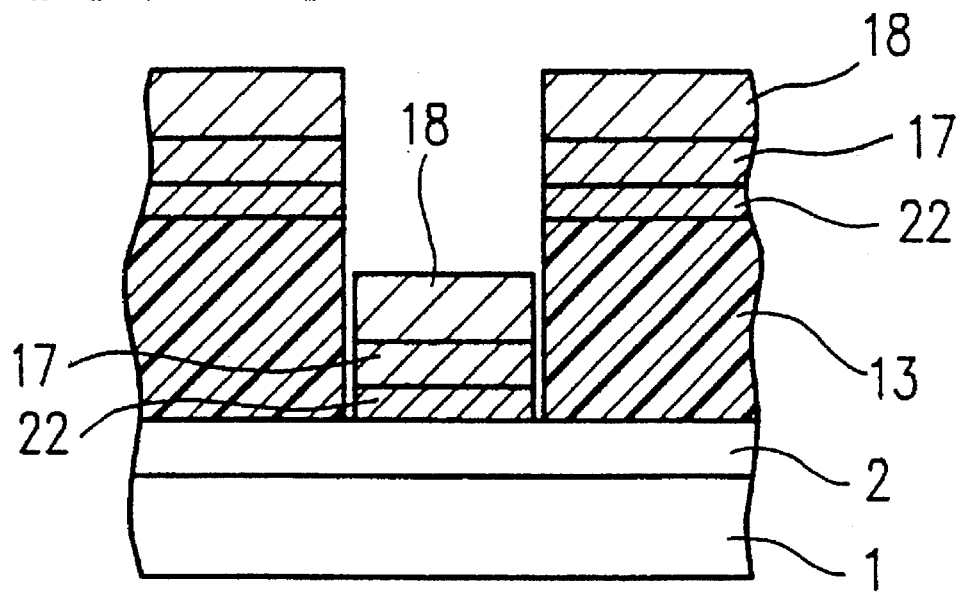
FIGS. 6A and 6B at a cross-sectional views for describing another method for producing a p-type ohmic electrode according to the present invention.
Figure 6B:
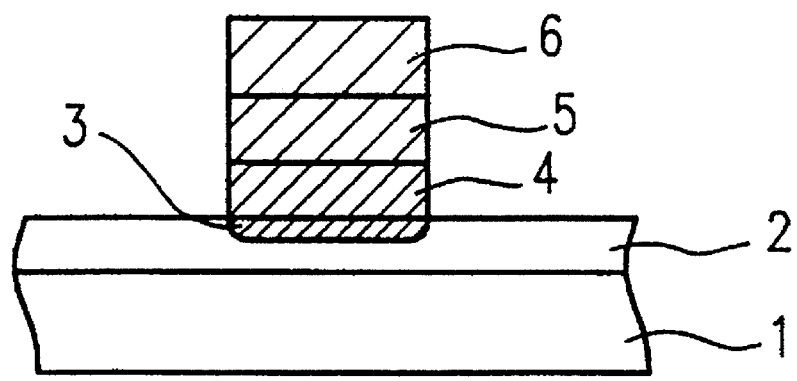

Although the metal multilayer film may contain films of Ni, Ti and Pt wherein Pt is the top layer, the metal multilayer film may also contain films of Ni, Ti and Pd (which is the same group as Pt) in which the Pt film is replaced by a film of Pd. Moreover, instead of separately forming a Ni film, a Ti film, and a Pt film, it is applicable to form an alloy film composed of Ni, Ti, and Pt. For example, as shown in FIG. 6A, an alloy film 22 of Ni, Ti, and Pt may be formed on a p-type GaAs layer 2 directly or via a thin semiconductor layer (not shown.), and after conducting a lift-off method, a p-type ohmic electrode 4 may be formed by a heat treatment, resulting in a configuration shown in FIG. 6B. The alloy film 22 may be deposited by simultaneously evaporating the respective metals. Alternatively, the alloy film 22 may be obtained by depositing a pre-fabricated alloy containing Ni, Ti, and Pt at the above-mentioned range of ratios.

The p-type ohmic electrode of the present invention is applicable to any other p-type III–V group semiconductor layer, as well as p-type GaAs layer. Preferable examples of III–V group semiconductors include AlGaAs, GaInAsP, AlGaInAs, AlGaAsSb, InAsSbP, AlGaInP, and GaAlN.

Hereinafter, an example will be described where the p-type ohmic electrode of the present invention is used as a base electrode of a bipolar transistor. As shown in FIG. 7, a bipolar transistor 41 according to the present invention includes a semiconductor multilayer structure 42 formed on a semi-insulating GaAs substrate 31. The semiconductor multilayer structure 42 includes a collect or contact layer 32 of $n^+$-GaAs, a collector layer 33 of $n^{31}$-GaAs, a base layer 34 of $p^+$-GaAs, an emitter layer 35 of n-AlGaAs, and an emitter contact layer 36 of $n^+$-InGaAs. An AlGaAs semiconductor constituting the emitter layer 35 has a larger band gap than of GaAs semiconductor constituting the base layer 34, the bipolar transistor 41 has therefore, a hetero-3unction structure.

A collector electrode 37 composed of an alloy of Au, Ge, and Ni is formed, as an n-type ohmic electrode, on a portion of the collector contact layer 32. A base electrode 38 is formed, as a p-type ohmic electrode, on a portion of the base layer 34. The base electrode 38 is composed of an alloy of Ni, Ti, and Pt, as described in the above-mentioned example. A diffusion layer 39 is formed in the base layer 34 in a portion below the base electrode 38. Moreover, an emitter electrode 40 is formed on the emitter contact layer 36.

Figure 8A:
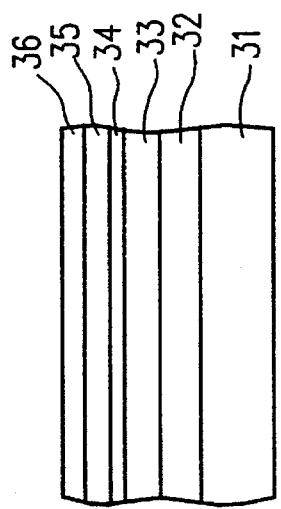
FIGS. 8A to 8F are cross-sectional views for describing a method for producing the bipolar transistor shown in FIG. 7.
Figure 8B:
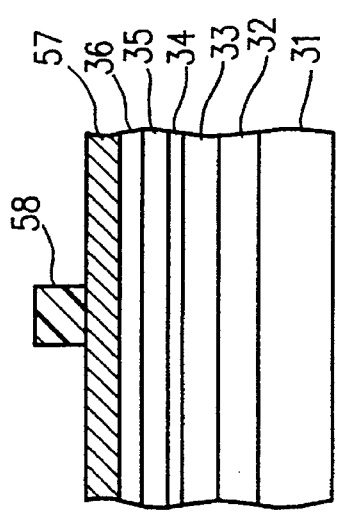

A method for producing the bipolar transistor 41 will be described with reference to FIGS. 8A to 8F. As shown in FIG. 8A, the collector contact layer 32 of $n^-$-GaAs, the collector layer 33 of $n^-$-GaAs, the base layer 34 of p-GaAs, the emitter layer 35 of n-AlGaAs, and the emitter contact layer 36 of $n^+$-InGaAs are epitaxially grown on the semi-insulating GaAs substrate 31 in this order. Next, as shown in FIG. 8B, a tungsten silicide (WSi) film 57 is formed on the emitter contact layer 36 by sputtering. Then, a resist pattern 58 is formed on the tungsten silicide film 57 by photolithography.

Figure 8C:
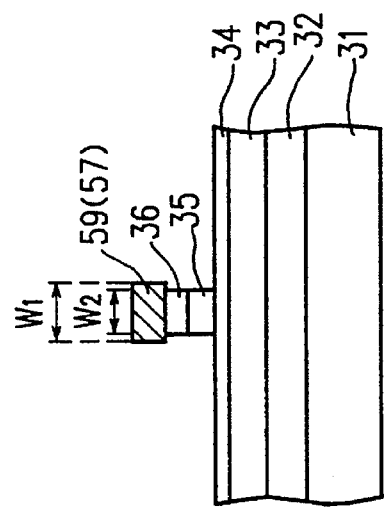

The tungsten silicide film 57 is etched by RIE (Reactive Ion Etching) while using the resist pattern 58 as a mask so as to form an electrode 59 as shown in FIG. 8C. Since the Schottky barrier height created by the contact between $n^+$-InGaAs and tungsten silicide is small, the electrode 59 is in contact with the emitter contact layer 36 with a low contact resistance without conducting a heat treatment.

Next, the emitter contact layer 36 and the emitter layer 35 are etched by wet etching while using the electrode 59 as a mask, so as to expose the surface of the base layer 34. A thin semiconductor layer of a portion of the emitter layer 35 may remain on the base layer 34. Since the emitter contact layer 36 and the emitter layer 35 are etched in an isotropical manner, the width $W_2$ of the emitter contact layer 36 and the emitter layer 35 becomes smaller than the width $W_1$ of the electrode 59.

Figure 8D:
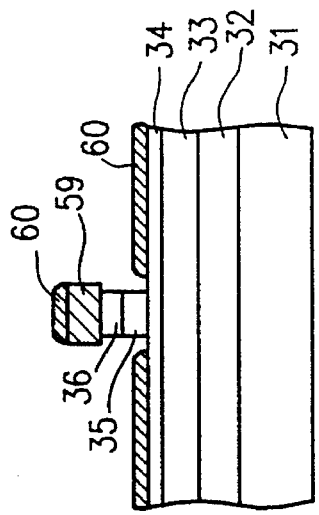

Thereafter, as shown in FIG. 8D, a metal multilayer film 60 is vapor deposited by an electron beam method so as to cover the entire semi-insulating GaAs substrate 31. The metal multilayer film 60 includes a Ni layer (thickness: 5 nm), a Ti layer (thickness: 5 nm), a Pt layer (thickness: 5 nm), a Ti layer (thickness: 30 nm), and a Pt layer (thickness: 100 nm).

Figure 8E:
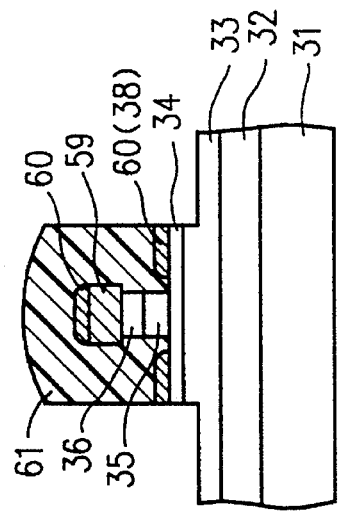

As shown in FIG. 8E, a resist pattern 61 is formed so as to cover the emitter contact layer 36. The emitter layer 35, and a portion of the metal multilayer film 60 that will become the base electrode 38. The metal multilayer film 60 and the base layer 34 are simultaneously etched by an ion milling method, while using the resist pattern 61 as a mask, until the collector layer 33 is exposed. Furthermore, a portion of the collector layer 33 is etched.

Figure 8F:
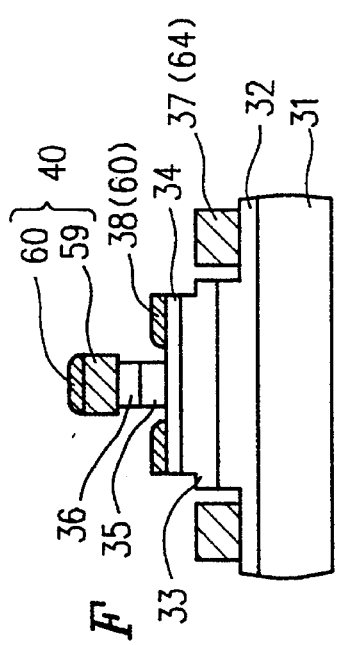

As shown in FIG. 8F, after removing the resist pattern 61, the collector contact layer 32 is exposed by photolithography and wet etching, and a metal multilayer film 64 composed of an Au-Ge layer (thickness: 100 nm), a Ni layer (thickness: 20 nm), and an Au layer (thickness: 200 nm) is formed by a lift-off method.

Finally, a heat treatment is conducted at 400° C. for 10 minutes, so as to alloy the metal multilayer film 64 and the collector layer 33 with each other, whereby the collector electrode 37 composed of an alloy of Au, Ge, and Ni is obtained. At the same time, the metal multilayer film 60 and the base layer 34 are alloyed with each other, whereby the base electrode 38 composed of an alloy of Ni, Ti, and Pt is obtained. Since the collector electrode 37 and the base electrode 38 are formed into alloys under optimum conditions, i.e., at 400° C., the former as an n-type ohmic electrode and the latter as a p-type ohmic electrode, they achieve extremely low contact resistances. The metal multilayer film 60 and the electrode 59 constitute the emitter electrode 40. Although the emitter contact layer 36 and the electrode 59 are heated during the above-mentioned heat treatment, the heat treatment is not particularly necessary for the emitter contact layer 36 and the electrode 59, a sufficient ohmic contact is achieved between the emitter contact layer 36 and the electrode 59 in a non-alloy ohmic contact manner.

In the above-described method for producing a bipolar transistor, the metal multilayer film 60 and the base layer 34 are simultaneously etched by using the resist pattern 61 as a mask after the metal multilayer film 60, which becomes the base electrode 38, is formed on the base layer 34. As a result, the base electrode 38 is formed in a self-alignment with the base layer 34. This maximizes the contact area between the base electrode 38 and the base layer 34, and yet reduces the base-collector capacitance. As a result, a bipolar transistor having excellent high-frequency characteristics can be produced. Moreover, either the collector electrode 37 or the base electrode 38 can be formed first, so that increased freedom is provided in the designing of the element structure.

On the other hand, in the case of the production of a bipolar transistor incorporating a conventional Pt/Ti/Pt/Au base electrode, those processes which require heat treatments at higher temperatures must be conducted first. Therefore, the base electrode must be formed after establishing a base layer and forming a collector electrode on a collector layer thereby making it very difficult to form the base electrode in a self-matching manner with respect to the base layer. As a result, a very complicated production process is required.

As shown in FIG. 7, it is applicable to provide a metal layer 71 having a low resistance on the base electrode 38 of the bipolar transistor 41 in order to reduce the resistance of the base electrode 38. In this case, it is preferable to cover side faces of the emitter layer 35 and the emitter contact layer 36 with an insulating film 73. A method for obtaining such an metal layer 71 and an insulating film 72 will be described below.

Figure 9A:
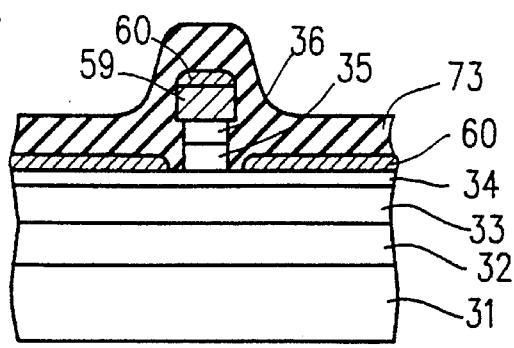
FIGS. 9A to 9D are cross-sectional views for describing a method for producing an Au layer on a p-type ohmic electrode of the bipolar transistor shown in FIG. 7.
Figure 9B:
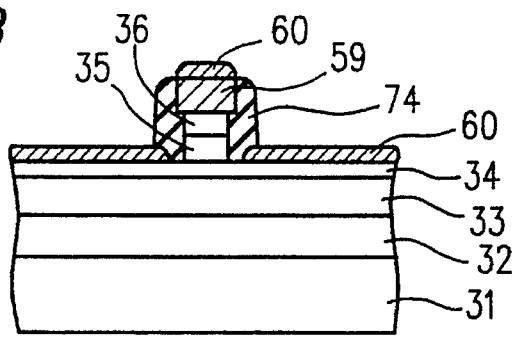

After vapor depositing the metal multilayer film 60 so as to cover the entire semi-insulating GaAs substrate 31 as described with reference to FIG. 8D, the insulating film 73, composed of silicon oxide or the like, is deposited so as to cover the entire semi-insulating GaAs substrate 31, as shown in FIG. 9A. Next, as shown in FIG. 9B, the insulating film 73 is etched by an anisotropy etching method until the surface of the metal multilayer film 60 is exposed, so as to be left as a side wall 74 covering the sides of the emitter layer 35 and the emitter contact layer 36.

Figure 9C:
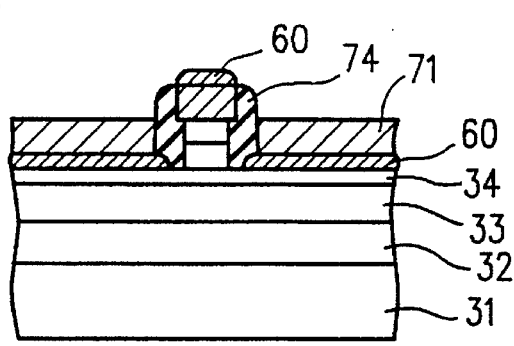
Figure 9D:
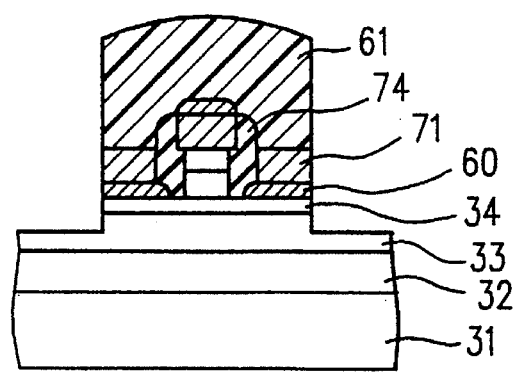
Figure 10:
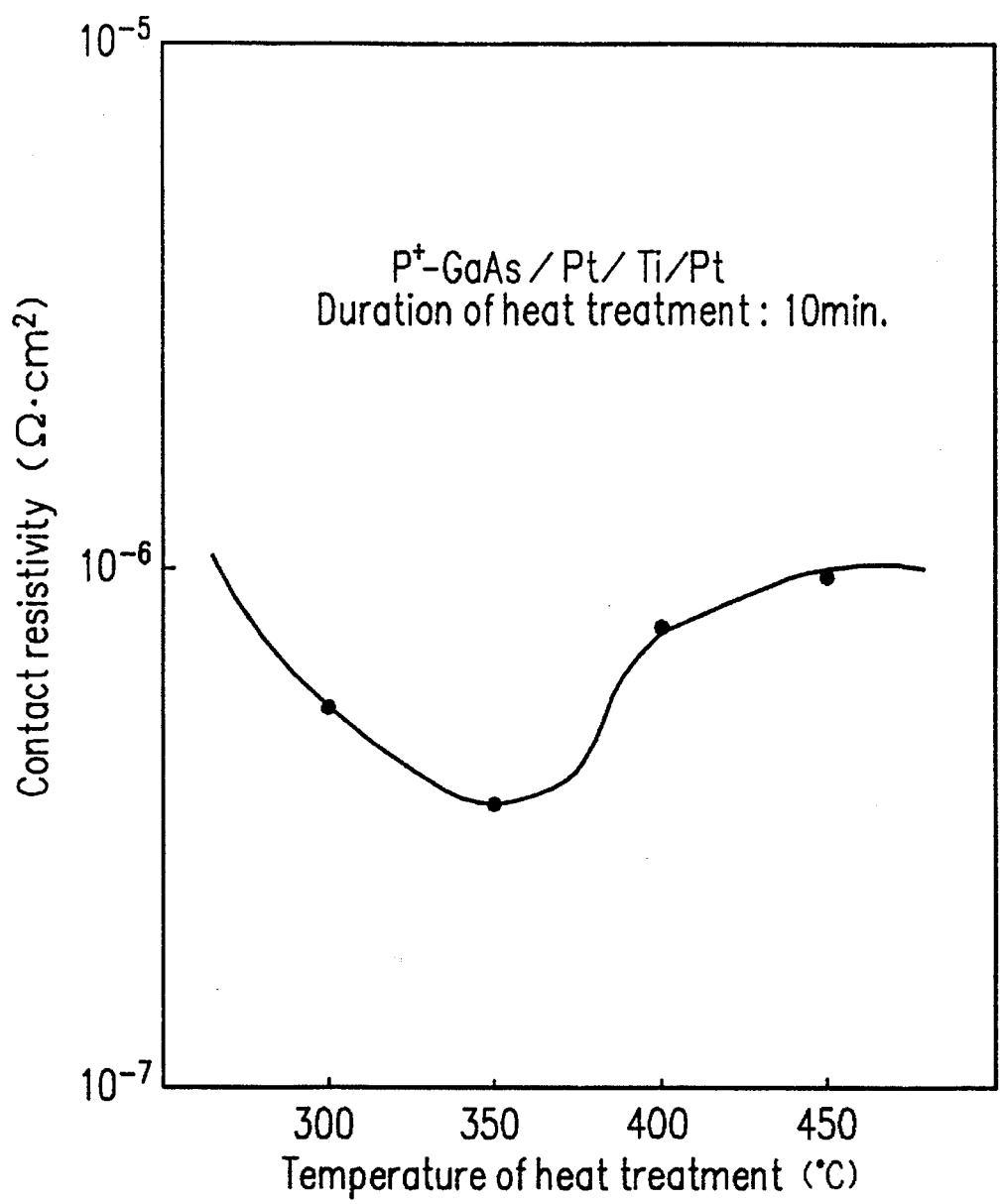
FIG. 10 is a graph showing the relationship between the temperature of a heat treatment and the contact resistivity of a conventional p-type ohmic electrode as obtained by the, inventors of the present invention through experiments.
Figure 11:
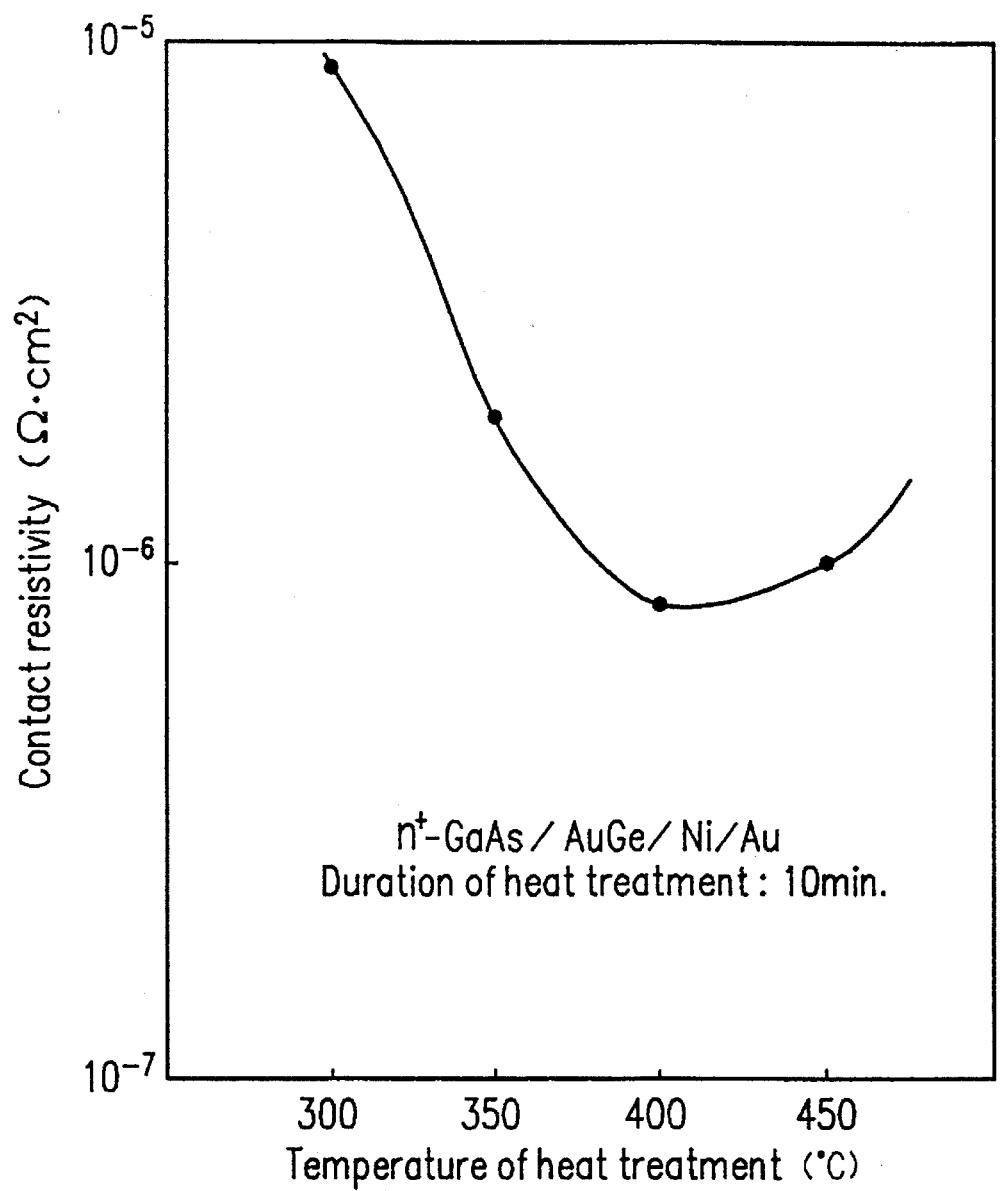
FIG. 11 is a graph showing the relationship between the temperature of a heat treatment and the contact resistivity of a conventional n-type ohmic electrode as obtained by the inventors of the present invention through experiments.

Subsequently, as shown in FIG. 9C, the metal layer 71, composed of Au, is formed on the metal multilayer film 60 by a plating method using the metal multilayer film 60 as an electrode. Then, as shown in FIG. 9D, the resist pattern 61 is formed, and the Au layer 71, the metal multilayer film 60, and the base layer 34 are etched by an ion milling method. Moreover, a portion of the collector layer 33 is etched. Thereafter, the process described with reference to FIG. 8F is continued.

In accordance with the above-mentioned structure, the Au layer 71 can be formed with a large thickness on the base electrode 38, without being electrically short-circuited with the emitter layer 35, the emitter contact layer 36, or the emitter electrode 40. The metallic resistance of the base electrode 38 can also be reduced. This structure is particularly advantageous if the base electrode is to be formed in a minute shape. Moreover, the high frequency characteristics of a high frequency device can be improved.

Although an emitter-up type structure, in which an emitter is disposed in an upper portion of the bipolar transistor was described in the above example, the present invention is applicable to a collector-up structure, in which a collector is disposed in an upper portion of the bipolar transistor. Although an npn-type bipolar transistor was described in the above example, the electrode of the present invention can be used as a collector electrode or as an emitter electrode of a pnp-type bipolar transistor.

As is appreciated form the aforementioned example, in a bipolar transistor of the invention, a p-type ohmic electrode of the invention and an n-type ohmic electrode may be formed directly on the base, emitter, and collector layers having an appropriate conductivity type, or on contact layers formed in contact with these layers.

Although a vertical-type transistor was described in the above example, it will be appreciated that the present invention is applicable to other compound semiconductor elements incorporating p-type ohmic electrodes as well.

In addition, a p-type ohmic electrode of the invention has a low Schottky barrier height against a p-type semiconductor, therefore, a p-type ohmic electrode has a high Schottky barrier height against an n-type semiconductor and as good a characteristic as a Schottky electrode. Accordingly, metal layers including Ni, Ti, and Pt or Pd may be applied to a gate electrode for n-channel MESFET. In this case, heat treatment is required for diffusing Pt into a n-type semiconductor layer.

According to the present invention, a highly reliable p-type ohmic electrode having a low contact resistivity can be provided.

Moreover, it is possible to simultaneously perform a heat treatment for the formation of a p-type ohmic electrode and an n-type ohmic electrode at the same temperature in the production of a bipolar transistor, thereby simplifying the production process. Since either of the p-type ohmic electrode or the n-type ohmic electrode can be formed first, it becomes possible to freely design a transistor without being limited by the production process thereof. Furthermore, by providing a low resistance layer on a p-type ohmic electrode so as to become a base electrode, the base resistance of the device is further reduced, thereby improving the high-frequency characteristics of the device operating at a high speed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An ohmic electrode for a p-type III–V compound semiconductor, the ohmic electrode being formed on a p-type III–V compound semiconductor layer, wherein the ohmic electrode includes nickel (Ni), titanium (Ti), and one of platinum (Pt) or palladium (Pal) as main components in an interface between the ohmic electrode and the p-type III-V compound semiconductor layer.

2. The ohmic electrode for a p-type III–V compound semiconductor according to claim 1, wherein the ohmic electrode includes Pd.

3. The ohmic electrode for a p-type III–V compound semiconductor according to claim 1, wherein the ohmic electrode includes Pt.

4. The ohmic electrode for a p-type III–V compound semiconductor according to claim 1, wherein the ohmic electrode is prepared by forming a metal layer made of Ni, Ti, and one of Pt or Pd on the p-type III–V compound semiconductor and alloying the metal layer with a portion of the p-type III–V compound semiconductor through a heat treatment at a temperature in a range of 360° C. to 460° C.

5. The ohmic electrode for a p-type III–V compound semiconductor according to claim 4, wherein the heat treatment is conducted at a temperature in a range of 370° C. to 420° C.

6. The ohmic electrode for a p-type III–V compound semiconductor according to claim 4, wherein the metal layer comprises a multilayer film comprising a Ni layer, a Ti layer, and a Pt layer, the Pt layer being an uppermost layer.

7. The ohmic electrode for a p-type III–V compound semiconductor according to claim 6, wherein the Ti layer has a thickness of 10 nm or less.

8. A bipolar transistor comprising: a p-type III–V compound semiconductor layer; and an ohmic electrode formed on the p-type III–V compound semiconductor layer wherein the ohmic electrode comprises Ni, Ti, and one of Pt or Pd as main components.

9. The bipolar transistor according to claim 8 further comprising an n-type III–V compound semiconductor layer and a second ohmic electrode formed on the n-type III-V compound semiconductor layer wherein the second ohmic electrode comprises gold (Au), germanium (Ge), and nickel (Ni) as main components.

10. The bipolar transistor according to claim 9, wherein the ohmic electrode includes Pd.

11. The bipolar transistor according to claim 8, wherein the ohmic electrode includes pt.

12. The bipolar transistor according to claim 8, wherein the ohmic electrode is prepared by forming a metal layer made of Ni, Ti, and one of Pt or Pd on the p-type III–V compound semicoductor and alloying the metal layer with a portion of the p-type III–V compound semiconductor through a heat treatment at a temperature of 370° C. to 420° C.

13. The bipolar transistor according to claim 12, wherein the heat treatment is conducted at a temperature in a range of 370° C. to 420° C.

14. The bipolar transistor according to claim 12, wherein the metal layer comprises a multiplayer film comprising a Ni layer, a Ti layer, and a Pt layer, the Pt layer being an uppermost layer.

15. the bipolar transistor according to claim 14, wherein, the Ti layer has a thickness of 10 nm or less.

* * * * *